United States Patent
Hsu

(10) Patent No.: US 6,423,574 B1
(45) Date of Patent: Jul. 23, 2002

(54) METHOD OF MANUFACTURING DIODES WITH CERAMIC BASE

(76) Inventor: Sheng-Husiung Hsu, 5F, No. 1, Lane 15, Tzu-Chiang Street, Tu-Chen Industrial District, Taipei Hsien (TW)

( * ) Notice: Subject to any disclaimer, the term of this patent is extended or adjusted under 35 U.S.C. 154(b) by 45 days.

(21) Appl. No.: 09/588,541

(22) Filed: Jun. 7, 2000

(51) Int. Cl.[7] .......................... H01L 21/44; H01L 21/48; H01L 21/50
(52) U.S. Cl. ....................................... 438/113; 438/125
(58) Field of Search ........................... 438/33, 106, 113, 438/124, 125, 126, 127, 460, 464, 107

(56) References Cited

U.S. PATENT DOCUMENTS 6,122,170 A * 9/2000 Hirose et al. ................ 361/704
6,159,771 A * 12/2000 Sheng-Hsiung ............. 438/113

FOREIGN PATENT DOCUMENTS

JP  363113369 A  *  5/1988  .................. 324/767

* cited by examiner

Primary Examiner—David Nelms
Assistant Examiner—Phuc T. Dang
(74) Attorney, Agent, or Firm—Rosenberg, Klein & Lee

(57) ABSTRACT

This invention is concerning a method of manufacturing diodes with ceramic base. It includes cutting grooves on the base to form hundreds of units; forming lower layer conductors on each units of the base; printing resistors and dice adhering to the base; coating the base with covering materials. After processed, salient on the dice tip is revealed, and then it is printed or plated with conductors. In this way, upper layer conductors are formed in order to link it to the border of each unit. Based on the brittle property of the base, it is cleaved into elongated rectangular blocks. Besides, terminals on the lateral are formed. After cauterized, they break into a single diode by automatism based on brittle property of the base. It is characterized that the base of the dice adhered to the lower layer conductors, a flat-shift vibrator can be applied to adhere the base of the dice to the lower layer conductors so as to benefit to the automatic manufacturing.

14 Claims, 10 Drawing Sheets

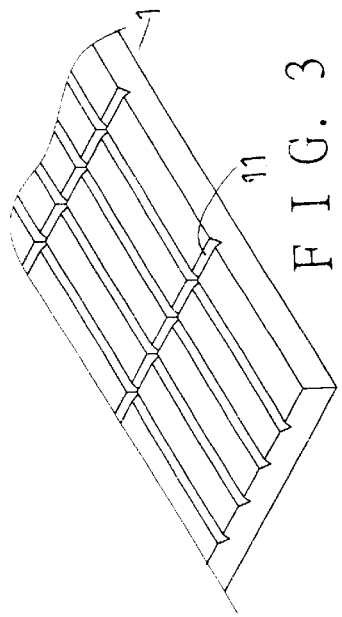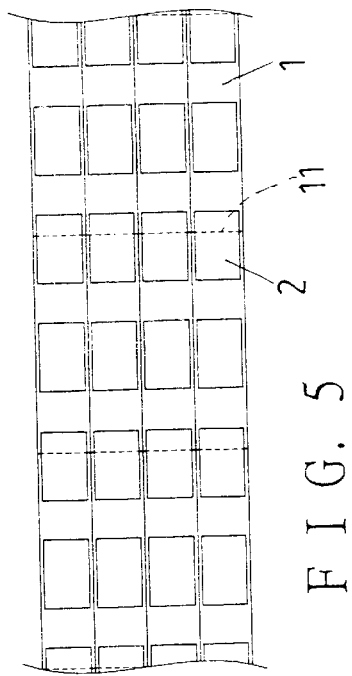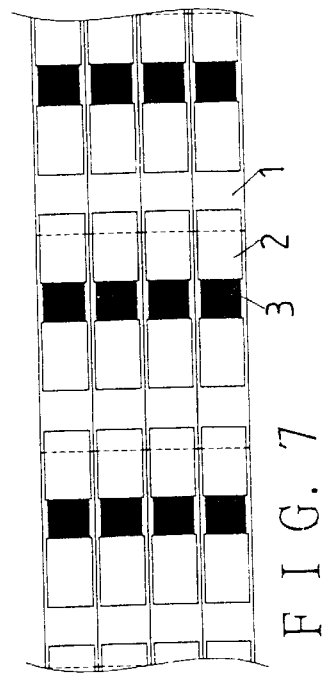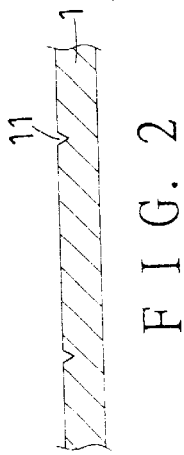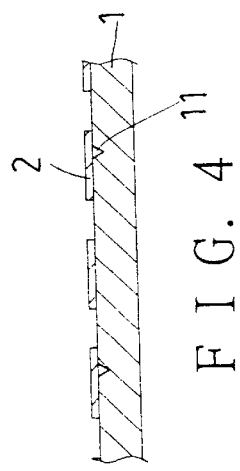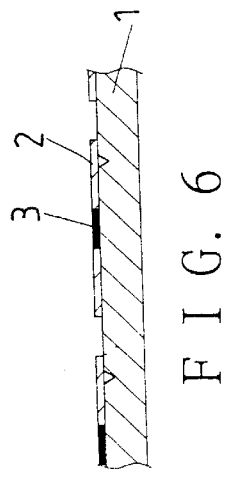

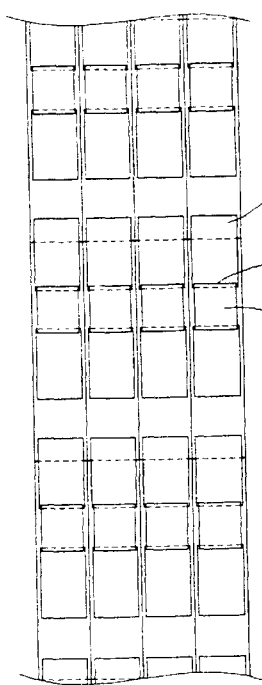 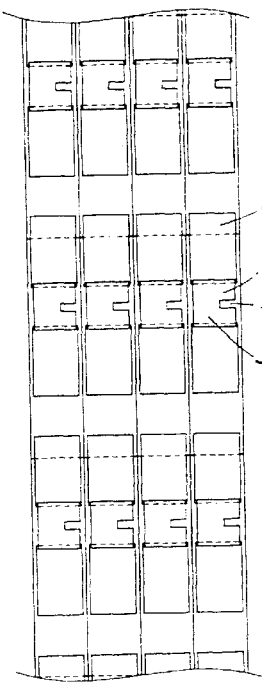 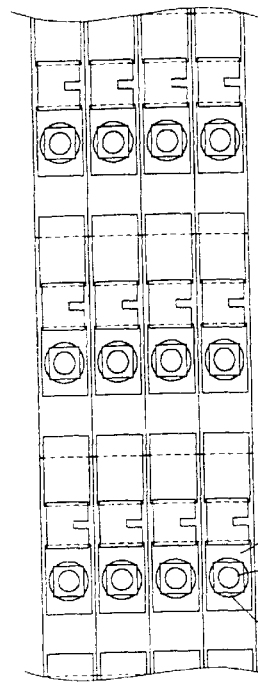
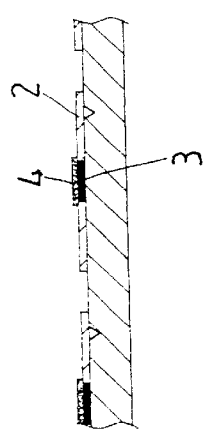 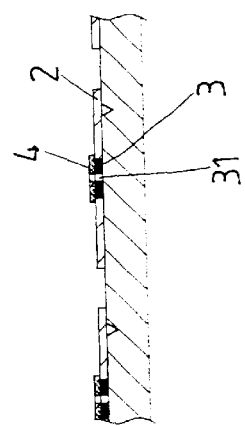 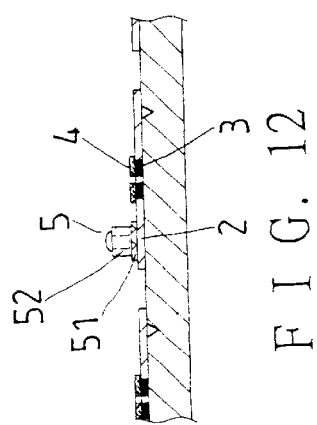

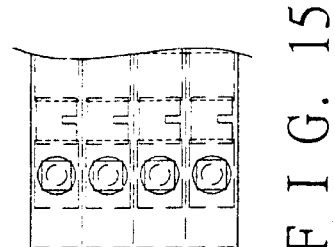
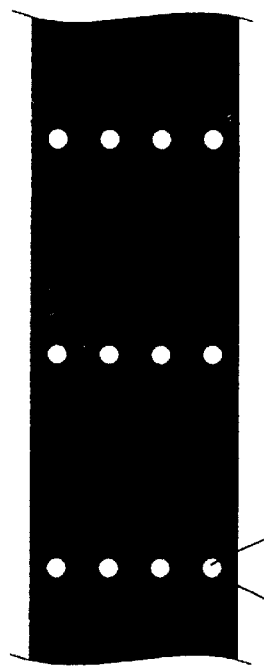
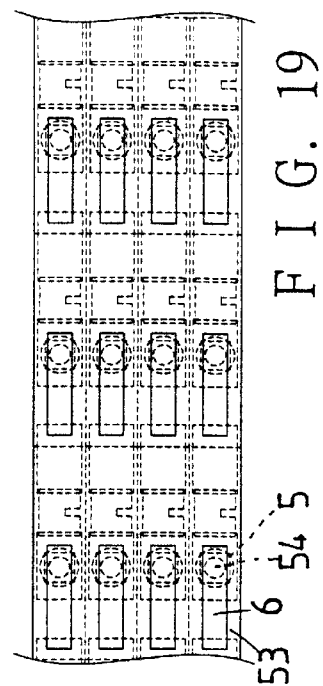
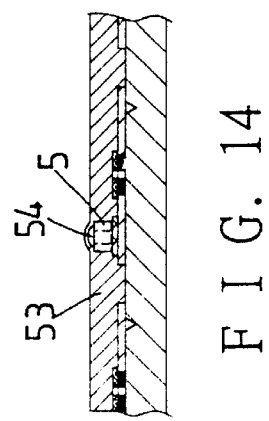
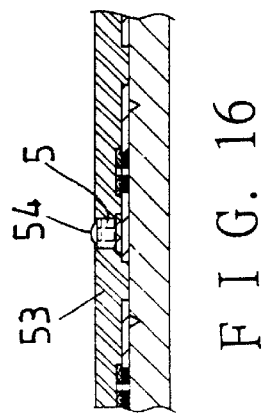
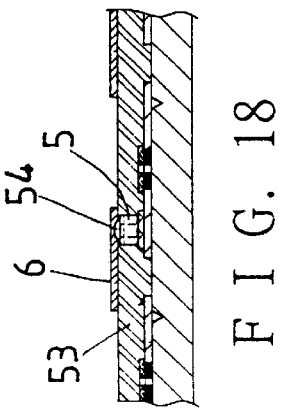
FIG. 15  FIG. 17  FIG. 19
FIG. 14  FIG. 16  FIG. 18

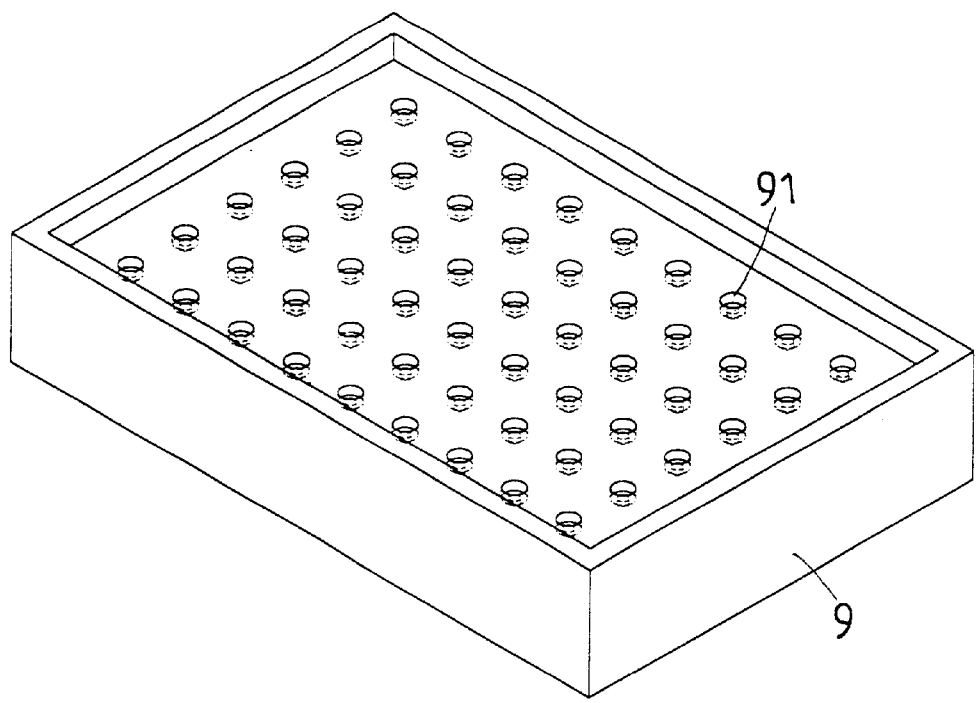
F I G. 32
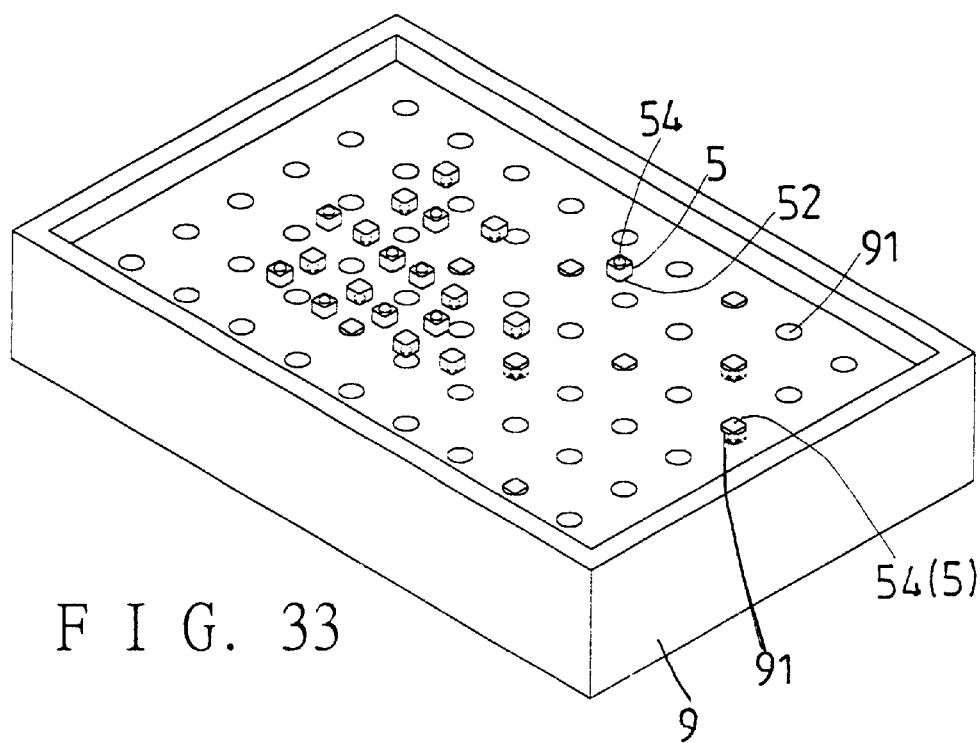
F I G. 33

METHOD OF MANUFACTURING DIODES WITH CERAMIC BASE

BACKGROUND OF THE INVENTION

This invention is concerning a method of manufacturing diodes with ceramic base and dice structure especially referring to a method of arraying the dice on the base with vibrator and packing resistors synchronally as well as forming dice array formation including diodes, resistors and capacitors therein.

The applicant has devoted himself to manufacture diodes for years, and a patent application titled "METHOD OF MANUFACTURING DIODES" was filed at the United States Patent & Trademark Office on Jul. 27, 1999 with filing Ser. No. 09/361,520, it has also been issued a Notice of Allowance by U.S.P.T.O. on Mar. 13, 2000.

Referring to FIGS. 37–40, they comprise the steps of:
(1) cutting grooves 101 on a ceramic base 10 to form hundreds of units 102;
(2) applying a layer of conductive paste all over salient of each of the unit 102 except a portion close to the right edge thereof to form lower layer conductors 20;
(3) adhering dice 30 to the lower layer conductors 20 of the base 10;
(4) applying covering materials 40 to the base 10 and the dice 30; letting the covering materials 40 to expose, developing the covering materials, and then removing the film to uncover the salient 301 of each die 30 and the grooves 101;
(5) applying a layer of the conductive paste all over the salient 301 of the dice 30 except a portion close to the left edge thereof to form upper layer conductors 50;
(6) coating protective glue 60 on the top of the units 102;
(7) serving the base 10 into a plurality of elongated rectangular blocks 103, and cauterizing the blocks 103 to form terminals 70 on both lateral, and then linking them with the lower layer conductors 20 and the upper layer conductors 50; and,
(8) cleaving the blocks 103 to be a single diode 80 from the grooves 101 of the base 10.

For making this invention more satisfied, an improved method of manufacturing diodes with ceramic base is provided.

SUMMARY OF THE INVENTION

Therefore, this invention is related to an improved method of manufacturing diodes with ceramic base.

The first object of the present invention is to provide an improved method, which can array dice on the ceramic base with a vibrator so as to benefit to automatic manufacturing.

The second object of the present invention is to provide an improved method, which a fixed die and resistor can be brought to the package during the same manufacturing.

The third object of the present invention is to provide an improved method, which is to form the combination of dice array, numerous dice can be packed at a time, and the dice can be diodes, resistors, capacitors and inductors. By this way, the convenience and efficiency increases, and more additional values can be created.

BRIEF DESCRIPTION OF THE DRAWINGS

The present invention will be better understood by reference to the accompanying drawings, wherein:

FIG. 2 is a cross-sectional view of a ceramic base with cutting grooves of the present invention.

FIG. 3 is a perspective view of base with the cutting grooves of the present invention.

FIG. 4 is a cross-sectional view of units printed with conductive paste or plated to form the lower layer conductor of the present invention.

FIG. 5 is a top view of the units printed with conductive paste or plated to form the lower layer conductor of the present invention.

FIG. 6 is a cross-sectional view of the printed or plated resistor between the conductors on the base of the present invention.

FIG. 7 is a top view of the printed or plated resistor between the conductors on the base of the present invention.

FIG. 8 is a cross-sectional view of the printed protective materials on the resistor of the present invention.

FIG. 9 is a top view of the printed protective materials on the resistor of the present invention.

FIG. 10 is a cross-sectional view of the laser corrected resistant value of the present invention.

FIG. 11 is a top view of the laser corrected resistant value of the present invention.

FIG. 12 is a cross-sectional view of adhering to the dice with conductive paste of the present invention.

FIG. 13 is a top view of adhering to the dice with conductive paste of the present invention.

FIG. 14 is a cross-sectional view of coating dice with the protective glue of the present invention.

FIG. 15 is top view of coating dice with the protective glue of the present invention.

FIG. 16 is a cross-sectional view of exposing the electrodes of the present invention.

FIG. 17 is a top view of exposing the electrodes of the present invention.

FIG. 18 is a cross-sectional view of the printed or plated conductors on the salient of the diode tips. In this place, an upper layer conductor is formed in order to link it to the border of each unit.

FIG. 19 is a top view of the printed or plated conductors on the salient of the diode tips. In this place, the upper layer conductor is formed in order to link it to the border of each unit.

FIG. 32 is a view of a vibrator of the present invention.

FIG. 33 is a view of a demonstration of the vibrator's action of the present invention.

DETAILED DESCRIPTION OF THE PREFERRED EMBODIMENT

Figure 1:
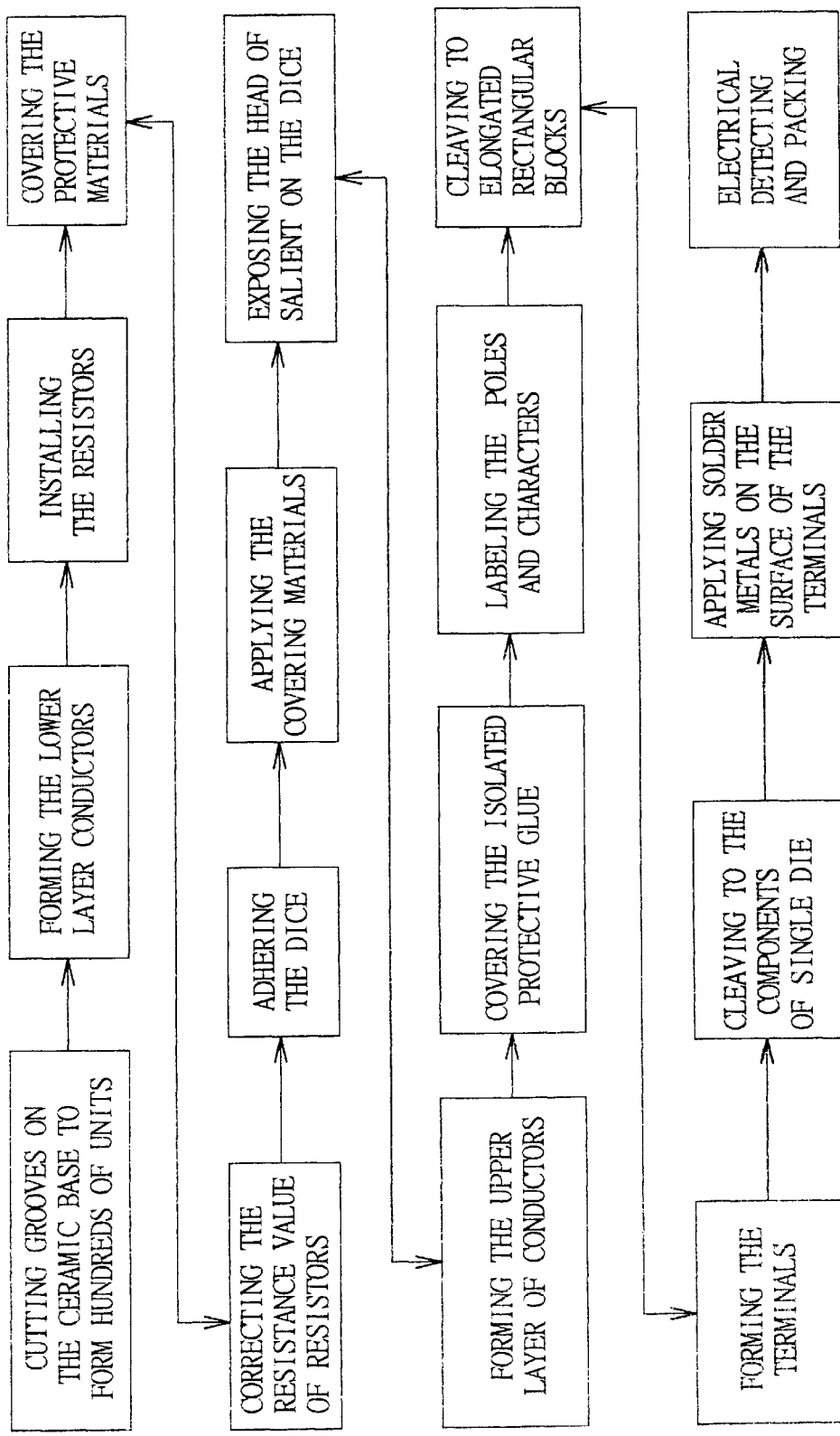
FIG. 1 is a flow chart of the present invention.

Firstly, referring to the FIG. 1, it is the flow chart of the present invention, wherein the manufacturing method is described as follows.

Step 1: Creating inverted triangles of cutting grooves 11 on the ceramic base 1 to form hundreds of units. These cutting grooves 11 not only are beneficial for breaking but also can provide more residual conductive areas when cleaving, as shown in FIGS. 2 and 3.

Step 2: The lower layer conductors 2 are formed by printing or plating the conductive paste on the surface of each unit of the base 1, as shown in FIGS. 4 and 5.

Step 3: Printing or plating resistors 3 with appropriate resistant value among the lower layer conductors 2 of each unit of the base I as shown in FIGS. 6 and 7.

Step 4: Coating the surface of resistors 3 with covering protective materials 4 in order to protect the resistors 3, and benefit the laser modification in the next step, as shown in FIGS. 8 and 9.

Step 5: If the resistant value of the printed resistors 3 is not consistent with the anticipation, correcting the resistance by using the laser to cut down a gap 31 and reduce the resistors 3, as shown in FIGS. 10 and 11.

Step 6: Adhering a bottom 52 of the dice 5 .(such-as diodes, LED, etc.) to the lower layer conductors 2 with the conductive paste (glue), as shown in FIGS. 12 and 13.

Step 7: For protecting the dice 5, mantling the covering materials 53 on the top, as shown in FIGS. 14 and 15.

Step 8: Exposing salient 54 on the dice 5 tip by using polishing, laser or chemical etching, as shown in FIGS. 16 and 17.

Step 9: Printing or plating the conductors on the salient 54 of the dice 5 tip and connecting the border of each unit to form the upper layer conductors 6, as shown in FIGS. 18 and 19.

Figure 21:
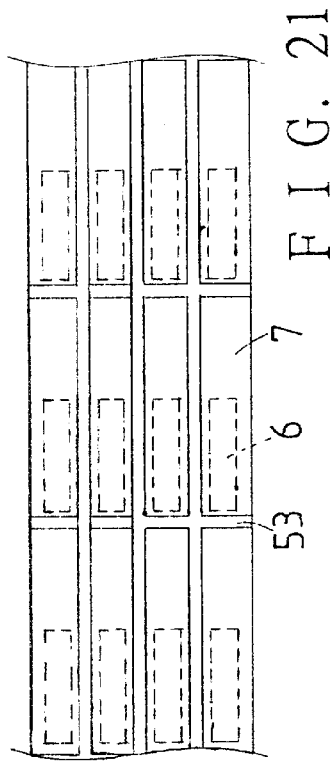
FIG. 21 is a top view of coating the top with the insulating protective glue of the present invention.
Figure 20:
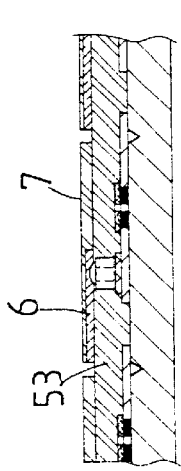
FIG. 20 is a cross-sectional view of coating the top with the insulating protective glue of the present invention.

Step 10: Coating the top with the isolated protective glue 7, as shown in FIGS. 20 and 21.

Figure 23:
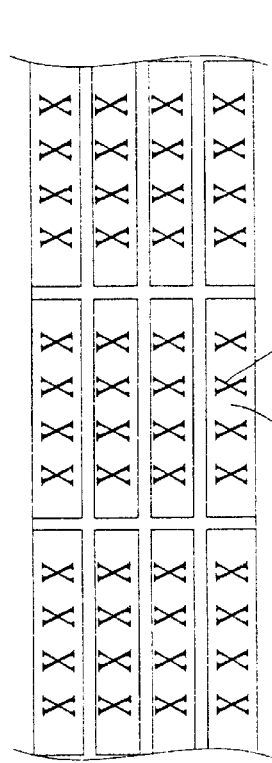
FIG. 23 is a top view of the pole labels and the printed words of the present invention.
Figure 22:
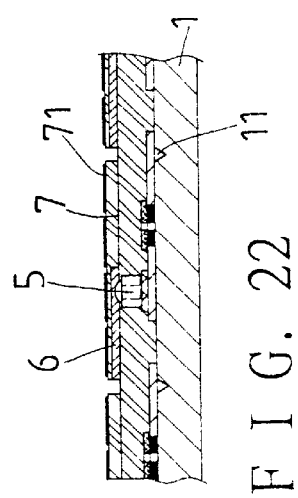
FIG. 22 is a cross-sectional view of the pole labels and the printed words of the present invention.

Step 11: Labeling the poles and characters 71 on the surface of the protective glue 7 by using ink or laser carving, as shown in FIGS. 22 and 23.

Figure 25:
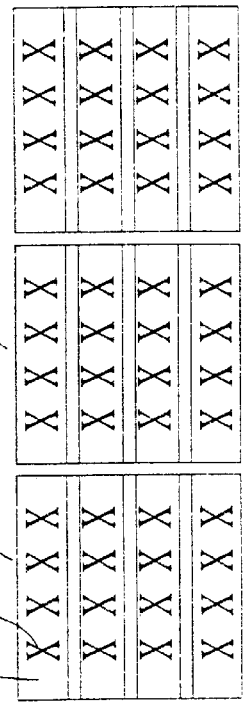
FIG. 25 is a top view of the whole base cleaved into the elongated rectangular blocks of the present invention.
Figure 24:
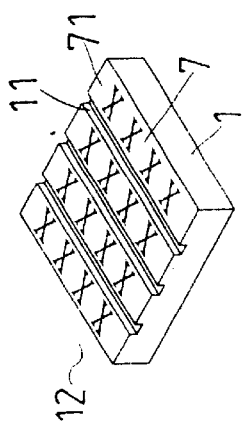
FIG. 24 is a perspective view of the whole base cleaved into elongated rectangular blocks of the present invention.

Step 12: Based on the brittleness and cutting grooves 11 of the base 1 itself cleaving it to elongated rectangular blocks 12 by automatism, as shown in FIGS. 24 and 25.

Figure 27:
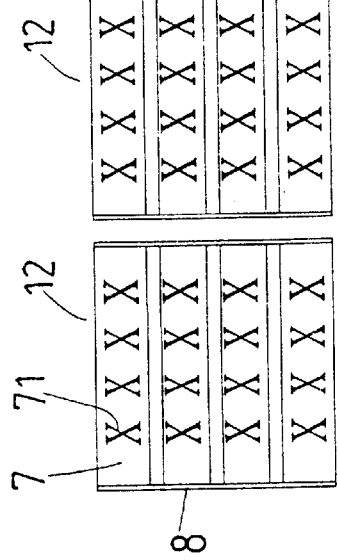
FIG. 27 is a top view of the conductive paste or conductors adhered on the both sides, or the formed terminal of the present invention.
Figure 26:
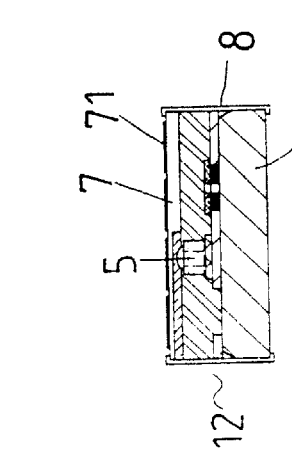
FIG. 26 is a cross-sectional view of the conductive paste or conductors adhered on the both sides, or the formed terminal of the present invention.

Step 13: Adhering the conductive paste or conductors to the lateral of the blocks 12 and cauterizing to form the terminals 8, as shown in FIGS. 26 and 27.

Figure 29:
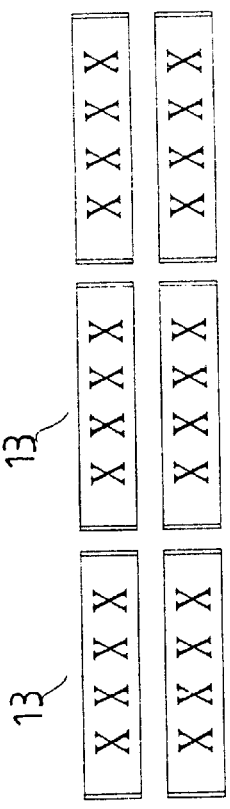
FIG. 29 is a top view of the present invention being broken into a single die.
Figure 28:
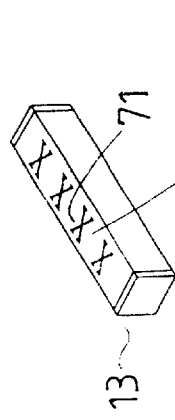
FIG. 28 is a perspective view of the present invention being broken into a single die.

Step 14: Based on the brittleness and cutting grooves 11 of the base 1 itself cleaving the diodes from the blocks 12 to single die 13 by automatism, as shown in FIGS. 28 and 29.

Figure 31:
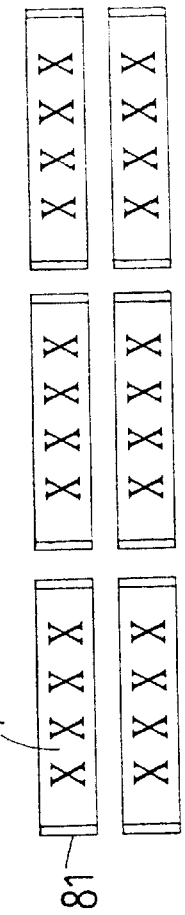
FIG. 31 is a top view of the solder metals adhered on the surface of the terminal of the present invention.
Figure 30:
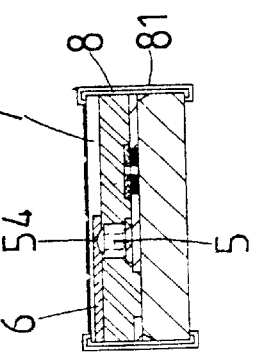
FIG. 30 is a cross-sectional of the solder metals adhered on the surface of the terminal of the present invention.

Step 15: Adhering solder metals 81 to the terminals 8 in order to protect the terminals surface from oxidation, and increase the solderability, as shown in FIGS. 30 and 31.

Step 16: Conducting the electrical detection and the packing.

Referring to FIGS. 32 and 33, in step 6, adhering the lower layer conductors 2 correctly to the bottom 52 of the dice 5 together with a flat-shift vibrator 9, which has funneled and stepped shape filled holes 91. Besides, the salient 54 of the dice 5 can be placed under the filled holes 91, the dice 5 themselves can be placed above these holes, and then the invert status can be brought out. That is to say, based on the specific vibrate frequency, the salient 54 of the downward dice 5 tip move faster than the bottom 52 of the downward die 5. On the other hand, the bottom 52 of the dice 5 fell on the filled holes 91 of the upward flat-shift vibrator 9, and this is beneficial for the bottom 52 of the dice 5 to adhere to the upper part of lower layer conductors 2 correctly. The dice 5 with the salient 54 are composed of a main unit of the semiconductor and a metal salient, which is some kind of the ground materials. Its appearance consists of a rectangle main body and a semicircle salient 54. Based on the different manifestation of physical character of the material and the appearance size, the proper kinetic energy can be transmitted by the vibrator 9. Because of the different physical properties, the salient 54 of the dice 5 are arranged downward, the dice 5 move forward at the same time, and then enter into the smelting instrument. At this moment all the dice 5 on the smelting instrument are toward the same direction, and in this way the mass dies adhesion to die mounted can be carried out.

Figure 34:
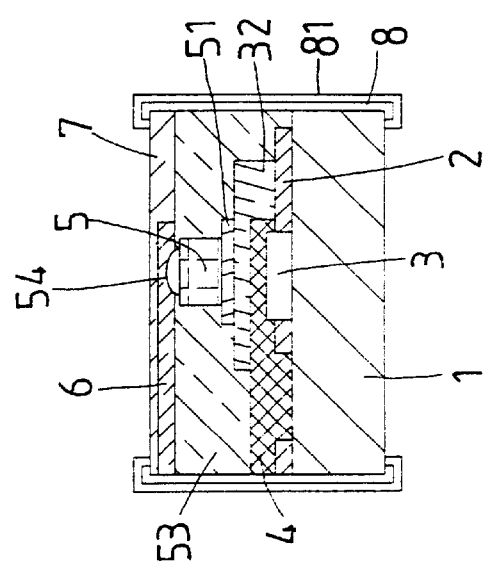
FIG. 34 is a view of the demonstration of putting the resistor beneath in under the dice of the present invention.
Figure 38:
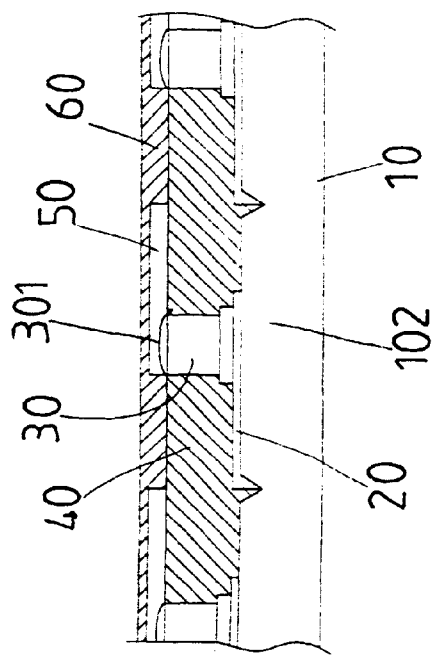
FIG. 38 is a cross-sectional view of protective glue printed on the top of the units according to the Background.
Figure 37:
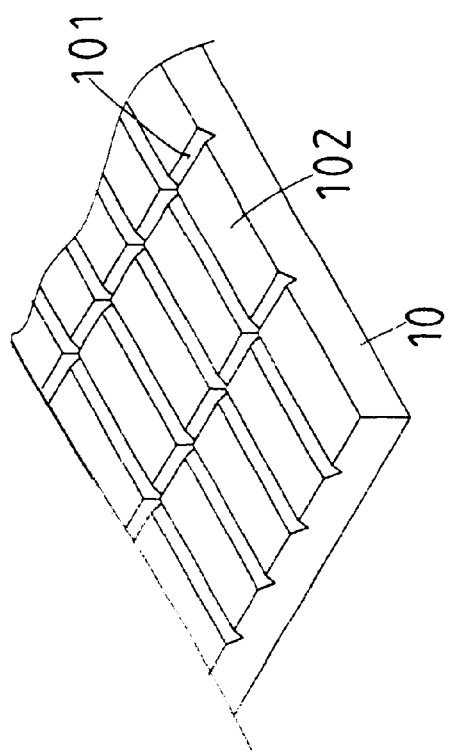
Figure 37 is a perspective view of the base with the cutting grooves of U.S. filing Ser. No. 09/361,520 described in the Background.
Figure 40:
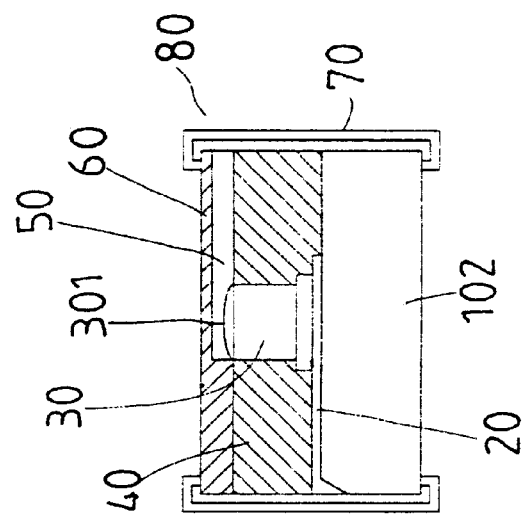
FIG. 40 is a cross-sectional view being broken into a diode according to the Background.
Figure 39:
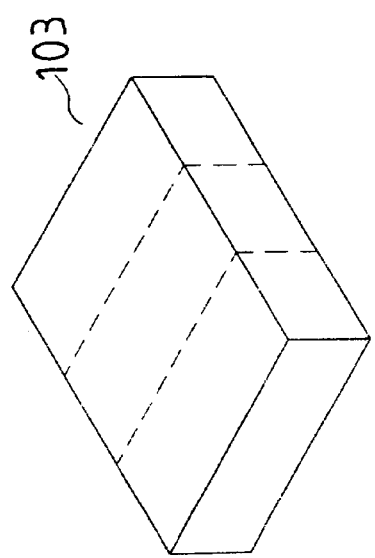
FIG. 39 is a perspective view of the base cleaved into the elongated rectangular blocks according to the Background.

Referring to FIG. 34, for achieving the aim that the products be small and light, the sixth step can be replaced by the following steps, which prints the conductors 32 to the tops of the lower layer conductors 2 and the protective materials 4 formed about the resistors 3, and places the dice 5 on the tops of the conductors 32.

Figure 35:
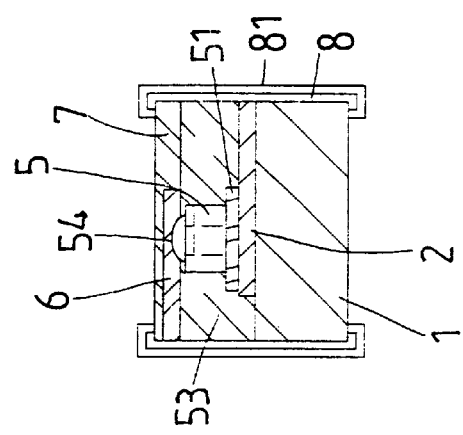
FIG. 35 is a view of a single die of the present invention.

Referring to FIG. 35, Step 3 to Step 5 can be left out, and only a single die 5 exists, if it is unnecessary to adopt the resistors 3.

Figure 36:
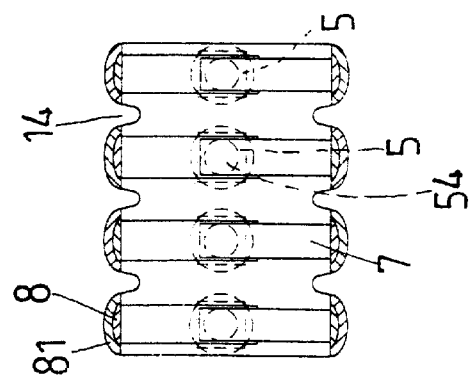
FIG. 36 is a view of the dice arraying components of the present invention.

Referring to FIG. 36 it is a diagram of the dice array formation. It indicates that to leave out Step 3 to Step 5 described above, and during Step 14, cleaving the blocks 12 into the dice array which is composed of several units. The base I can make fillisters 14 in advance for the convenience of forming the terminal on the lateral side in Step 13. At the same time, in addition to the diode, the dice 5 of the units can be resistors, capacitors or inductors. Accordingly various combinations should be collocated depending on the requirement and the die array assembly containing several dice should be arranged.

Based on the above-mentioned statements, it is obvious that the invention has the following advantages:

1. It is benefit to the automatic manufacturing that utilizes the vibrator to array the dice on the ceramic base.
2. A fixed die and resistor can be brought to the package during the same manufacturing procedure.
3. This invention can form the combination of die array, numerous dice can be packed at a time, and the dice can be diodes, resistors, capacitors or inductors. In this way, the convenience and efficiency will increase, and more additional values can be created.

What is claimed is:

1. A method of manufacturing diodes with ceramic base comprising the steps of:
   (1) cutting grooves on a ceramic base to form a plurality of units;
   (2) forming at least one lower layer conductor on each said unit of said base;
   (3) forming resistors with predetermined resistance values adjacent said lower layer conductor of each said unit, and coating surfaces of said resistors with a protective material;
   (4) placing on a flat-shift vibrator having a plurality of funneled stepped shape filled holes a plurality of dice each having salient formed on an upper surface thereof;
   (5) operating said flat-shift vibrator at a specific vibrating frequency to cause migration of said dice into said filled holes of said vibrator, said dice engaging said filled holes to be oriented therein with said upper surfaces directed downward, bottom portions of said dice being thereby exposed at said filled holes;
   (6) adhering said bottoms of said dice to said lower layer conductors of said base with conductive paste;
   (7) coating said dice of said base with covering materials;
   (8) exposing said salient on said upper surfaces of said dice;
   (9) adhering conductors to said salient of said dice tips and linking them to a border of each said unit so as to form upper layer conductors;
   (10) coating protective glue on top of said units;
   (11) separating said base into a plurality of elongated rectangular blocks;
   (12) cauterizing said blocks to form terminals on lateral portions thereof; and,
   (13) cleaving said blocks at said grooves of said base to form a plurality of single diodes.

2. A method of manufacturing diodes with ceramic base as claimed in claim 1, wherein said resistors are formed by printing.

3. A method of manufacturing diodes with ceramic base as claimed in claim 1, wherein said resistors are formed by plating.

4. A method of manufacturing diodes with ceramic base as claimed in claim 1, wherein laser can be used to cut down a gap and reduce said resistors to correct the resistance value.

5. A method of manufacturing electronic devices having ceramic bases comprising the steps of:
   (1) cutting grooves on a ceramic base to form a plurality of units;
   (2) forming at least one lower layer conductor on each said unit of said base;
   (3) placing on a flat-shift vibrator having a plurality of funneled stepped shape filled holes a plurality of dice each having salient formed on an upper surface thereof, said dice being selected from the group of devices consisting of: diodes, resistors, capacitors, and inductors;
   (4) operating said flat-shift vibrator at a specific vibrating frequency to cause migration of said dice into said filled holes of said vibrator, said dice engaging said filled holes to be oriented therein with said upper surfaces directed downward, bottom portions of said dice being thereby exposed at said filled holes;
   (5) adhering said bottoms of said dice to said lower layer conductors of said base with conductive paste;
   (6) coating said dice of said base with covering materials;
   (7) exposing said salient on said upper surfaces of said dice;
   (8) adhering conductors to said salient of said dice tips and linking them to a border of each said unit so as to form upper layer conductors;
   (9) coating protective glue on top of said units;
   (10) separating said base into a plurality of elongated rectangular blocks;
   (11) cauterizing said blocks to form terminals on lateral portions thereof; and,
   (12) cleaving said blocks at said grooves of said base to form a plurality of dice arrays each having a plurality of said units;
   whereby various combinations of devices may be collocated on each said dice array.

6. A method of manufacturing diodes with ceramic base comprising the steps of:
   (1) cutting grooves on a ceramic base to form a plurality of units;
   (2) forming at least one lower layer conductor on each said unit of said base;
   (3) placing on a flat-shift vibrator having a plurality of funneled stepped shape filled holes a plurality of dice each having salient formed on an upper surface thereof, at least a portion of said dice including a light-emitting diode;
   (4) operating said flat-shift vibrator at a specific vibrating frequency to cause migration of said dice into said filled holes of said vibrator, said dice engaging said filled holes to be oriented therein with said upper surfaces directed downward, bottom portions of said dice being thereby exposed at said filled holes;
   (5) adhering said bottoms of said dice to said lower layer conductors of said base with conductive paste;
   (6) coating said dice of said base with covering materials;
   (7) exposing said salient on said upper surfaces of said dice;
   (8) adhering conductors to said salient of said dice tips and linking them to a border of each said unit so as to form upper layer conductors;
   (9) coating protective glue on top of said units;
   (10) separating said base into a plurality of elongated rectangular blocks;
   (11) cauterizing said blocks to form terminals on lateral portions thereof; and,
   (12) cleaving said blocks at said grooves of said base to form a plurality of single diodes.

7. A method of manufacturing diodes with ceramic base comprising the steps of:
   (1) cutting grooves on a ceramic base to form a plurality of units;
   (2) forming at least one lower layer conductor on each said unit of said base;
   (3) placing on a flat-shift vibrator having a plurality of funneled stepped shape filled holes a plurality of dice each having salient formed on an upper surface thereof, at least a portion of said dice including a light-emitting diode;
   (4) operating said flat-shift vibrator at a specific vibrating frequency to cause migration of said dice into said filled holes of said vibrator, said dice engaging said filled holes to be oriented therein with said upper surfaces directed downward, bottom portions of said dice being thereby exposed at said filled holes;

(5) printing at least one intermediary conductor on said lower layer conductor and disposing said dice thereon for minimizing the size and weight of said diodes;

(6) coating said dice of said base with covering materials;

(7) exposing said salient on said upper surfaces of said dice;

(8) adhering conductors to said salient of said dice tips and linking them to a border of each said unit so as to form upper layer conductors;

(9) coating protective glue on top of said units;

(10) separating said base into a plurality of elongated rectangular blocks;

(11) cauterizing said blocks to form terminals on lateral portions thereof; and, (12) cleaving said blocks at said grooves of said base to form a plurality of single diodes.

8. A method of manufacturing diodes with ceramic base as claimed in claim 1, wherein said dice can also be a light-emitting diode.

9. A method of manufacturing diodes with ceramic base as claimed in claim 5, wherein said dice can also be a light-emitting diode.

10. A method of manufacturing diodes having ceramic bases comprising the steps of:

(1) cutting grooves on a ceramic base to form a plurality of units;

(2) forming at least one lower layer conductor on each said unit of said base;

(3) placing on a flat-shift vibrator having a plurality of funneled stepped shape filled holes a plurality of dice each having salient formed on an upper surface thereof;

(4) operating said flat-shift vibrator at a specific vibrating frequency to cause migration of said dice into said filled holes of said vibrator, said dice engaging said filled holes to be oriented therein with said upper surfaces directed downward, bottom portions of said dice being thereby exposed at said filled holes;

(5) disposing said dice over said lower layer conductors of said base;

(6) coating said dice of said base with covering materials;

(7) exposing said salient on said upper surfaces of said dice;

(8) adhering conductors to said salient of said dice tips and linking them to a border of each said unit so as to form upper layer conductors;

(9) coating protective glue on top of said units;

(10) separating said base into a plurality of elongated rectangular blocks;

(11) cauterizing said blocks to form terminals on lateral portions thereof; and, (12) cleaving said blocks at said grooves of said base to form a plurality of diode devices.

11. The method of manufacturing diodes with ceramic base as recited in claim 10 wherein step (5) includes adhering said bottoms of said dice to said lower layer conductors of said base with conductive paste.

12. The method of manufacturing diodes with ceramic base as recited in claim 10 wherein step (5) includes printing at least one intermediary conductor on said lower layer conductor and disposing said dice thereon for minimizing the size and weight of said diodes.

13. The method of manufacturing diodes with ceramic base as recited in claim 10 wherein said blocks in step (12) are cleaved at said grooves of said base to form a plurality of dice arrays, each said dice array having a plurality of said units.

14. The method of manufacturing diodes with ceramic base as recited in claim 10 wherein at least a portion of said dice each includes a light-emitting diode.

\* \* \* \* \*